(12) United States Patent
Parthasarathy

(10) Patent No.: US 8,653,600 B2
(45) Date of Patent: Feb. 18, 2014

(54) HIGH-VOLTAGE MONOLITHIC SCHOTTKY DEVICE STRUCTURE

(75) Inventor: Vijay Parthasarathy, Mountain View, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 13/487,025

(22) Filed: Jun. 1, 2012

(65) Prior Publication Data

US 2013/0320482 A1 Dec. 5, 2013

(51) Int. Cl.
*H01L 29/66* (2006.01)

(52) U.S. Cl.
USPC .......................................... 257/367; 257/471

(58) Field of Classification Search
USPC ......... 257/329, 327, 328, 331, 330, 341, 471, 257/E29.118, E29.133, E29.257, E29.262
See application file for complete search history.

(56) References Cited

U.S. PATENT DOCUMENTS

| | | | |
|---|---|---|---|
| 5,008,794 A | 4/1991 | Leman | |
| 5,072,268 A | 12/1991 | Rumennik | |
| 5,164,891 A | 11/1992 | Keller | |
| 5,258,636 A | 11/1993 | Rumennik et al. | |
| 5,274,259 A | 12/1993 | Grabowski et al. | |
| 5,285,367 A | 2/1994 | Keller | |
| 5,313,082 A | 5/1994 | Eklund | |
| 5,323,044 A | 6/1994 | Rumennik et al. | |
| 5,411,901 A | 5/1995 | Grabowski et al. | |
| 5,612,567 A | 3/1997 | Baliga | |
| 6,084,277 A | 7/2000 | Disney et al. | |
| 6,168,983 B1 | 1/2001 | Rumennik et al. | |
| 6,191,447 B1 * | 2/2001 | Baliga | 257/330 |
| 6,207,994 B1 | 3/2001 | Rumennik et al. | |
| 6,424,007 B1 | 7/2002 | Disney | |
| 6,465,291 B1 | 10/2002 | Disney | |

(Continued)

FOREIGN PATENT DOCUMENTS

| | | |
|---|---|---|
| EP | 1689001 | 8/2006 |
| EP | 1959496 | 8/2008 |
| WO | 2007105384 | 9/2007 |

OTHER PUBLICATIONS

Mehrotra et al. "Trench MOS Barrier Schottky (TMBS) Rectifier: A Schottky Rectifier with Higher Than Parallel Plane Breakdown Voltage". Solid State Electronics, Elsevier Science Publishers, Barking, GB. vol. 38, No. 4, Apr. 1, 1995. pp. 801-806. XP004024828. ISBN; 0038-1101.

*Primary Examiner* — Yu-Hsi D Sun
*Assistant Examiner* — Christina Sylvia
(74) *Attorney, Agent, or Firm* — The Law Offices of Bradley J. Bereznak

(57) ABSTRACT

A semiconductor device includes a pillar formed on a substrate of the same conductivity type. The pillar has a vertical thickness that extends from a top surface down to the substrate. The pillar extends in first and second lateral directions in a loop shape. First and second dielectric regions are disposed on opposite lateral sides of the pillar, respectively. First and second conductive field plates are respectively disposed in the first and second dielectric regions. A metal layer is disposed on the top surface of the pillar, the metal layer forming a Schottky diode with respect to the pillar. When the substrate is raised to a high-voltage potential with respect to both the metal layer and the first and second field plates, the first and second field plates functioning capacitively to deplete the pillar of charge, thereby supporting the high-voltage potential along the vertical thickness of the pillar.

21 Claims, 10 Drawing Sheets

(56) References Cited

U.S. PATENT DOCUMENTS

| | | |
|---|---|---|
| 6,468,847 B1 | 10/2002 | Disney |
| 6,489,190 B2 | 12/2002 | Disney |
| 6,501,130 B2 | 12/2002 | Disney |
| 6,504,209 B2 | 1/2003 | Disney |
| 6,509,220 B2 | 1/2003 | Disney |
| 6,552,597 B1 | 4/2003 | Disney |
| 6,555,873 B2 | 4/2003 | Disney et al. |
| 6,555,883 B1 | 4/2003 | Disney et al. |
| 6,563,171 B2 | 5/2003 | Disney |
| 6,570,219 B1 | 5/2003 | Rumennik et al. |
| 6,573,558 B2 | 6/2003 | Disney |
| 6,583,663 B1 | 6/2003 | Disney |
| 6,633,065 B2 | 10/2003 | Rumennik et al. |
| 6,635,544 B2 | 10/2003 | Disney |
| 6,639,277 B2 | 10/2003 | Rumennik et al. |
| 6,667,213 B2 | 12/2003 | Disney |
| 6,680,646 B2 | 1/2004 | Disney |
| 6,724,041 B2 | 4/2004 | Rumennik et al. |
| 6,730,585 B2 | 5/2004 | Disney |
| 6,734,714 B2 | 5/2004 | Disney |
| 6,750,105 B2 | 6/2004 | Disney |
| 6,759,289 B2 | 7/2004 | Disney |
| 6,768,171 B2 | 7/2004 | Disney |
| 6,768,172 B2 | 7/2004 | Rumennik et al. |
| 6,777,749 B2 | 8/2004 | Rumennik et al. |
| 6,781,198 B2 | 8/2004 | Disney |
| 6,787,437 B2 | 9/2004 | Rumennik et al. |
| 6,787,847 B2 | 9/2004 | Disney et al. |
| 6,798,020 B2 | 9/2004 | Disney et al. |
| 6,800,903 B2 | 10/2004 | Rumennik et al. |
| 6,815,293 B2 | 11/2004 | Disney et al. |
| 6,818,490 B2 | 11/2004 | Disney |
| 6,825,536 B2 | 11/2004 | Disney |
| 6,828,631 B2 | 12/2004 | Rumennik et al. |
| 6,838,346 B2 | 1/2005 | Disney |
| 6,865,093 B2 | 3/2005 | Disney |
| 6,882,005 B2 | 4/2005 | Disney et al. |
| 6,987,299 B2 | 1/2006 | Disney et al. |
| 7,115,958 B2 | 10/2006 | Disney et al. |
| 7,135,748 B2 | 11/2006 | Balakrishnan |
| 7,220,629 B2 | 5/2007 | Balakrishnan |
| 7,221,011 B2 | 5/2007 | Banerjee et al. |
| 7,253,042 B2 | 8/2007 | Disney |
| 7,253,059 B2 | 8/2007 | Balakrishnan |
| 7,335,944 B2 | 2/2008 | Banerjee |
| 7,381,618 B2 | 6/2008 | Disney |
| 7,391,088 B2 | 6/2008 | Balakrishnan |
| 7,459,366 B2 | 12/2008 | Banerjee |
| 7,468,536 B2 | 12/2008 | Parthasarathy |
| 7,494,875 B2 | 2/2009 | Disney |
| 7,557,406 B2 | 7/2009 | Parthasarathy |
| 7,585,719 B2 | 9/2009 | Balakrishnan |
| 7,595,523 B2 | 9/2009 | Parthasarathy et al. |
| 7,648,879 B2 | 1/2010 | Banerjee et al. |
| 7,732,860 B2 | 6/2010 | Parthasarathy et al. |
| 7,745,291 B2 | 6/2010 | Disney |
| 7,786,533 B2 | 8/2010 | Disney |
| 7,791,132 B2 | 9/2010 | Banerjee et al. |
| 7,816,731 B2 | 10/2010 | Parthasarathy |
| 7,829,944 B2 | 11/2010 | Disney |
| 7,859,037 B2 | 12/2010 | Parthasarathy et al. |
| 7,863,172 B2 | 1/2011 | Zhu et al. |
| 7,871,882 B2 | 1/2011 | Parthasarathy |
| 7,875,962 B2 | 1/2011 | Balakrishnan |
| 7,893,754 B1 | 2/2011 | Kung |
| 2003/0038335 A1* | 2/2003 | Huang et al. .................. 257/508 |
| 2003/0136974 A1 | 7/2003 | Yedinak et al. |
| 2003/0209781 A1 | 11/2003 | Hattori |
| 2005/0145977 A1 | 7/2005 | Alessandria et al. |
| 2005/0167749 A1* | 8/2005 | Disney .......................... 257/341 |
| 2005/0263852 A1 | 12/2005 | Ogura et al. |
| 2007/0138547 A1 | 6/2007 | Nakamura |
| 2007/0200183 A1 | 8/2007 | Rueb et al. |
| 2008/0197406 A1 | 8/2008 | Parthasarathy et al. |
| 2008/0197418 A1* | 8/2008 | Parthasarathy et al. ........ 257/367 |
| 2010/0155831 A1* | 6/2010 | Parthasarathy et al. ........ 257/329 |
| 2010/0213470 A1* | 8/2010 | Yamazaki et al. .............. 257/77 |

* cited by examiner

HIGH-VOLTAGE MONOLITHIC SCHOTTKY DEVICE STRUCTURE

TECHNICAL FIELD

The present disclosure relates to semiconductor device structures and processes for fabricating high-voltage semiconductor devices; more specifically, to Schottky device structures and methods of manufacture thereof.

BACKGROUND

The Schottky diode (named after German physicist Walter H. Schottky) is a well-known semiconductor diode device that is achieved using a metal-semiconductor junction, frequently referred to as a Schottky barrier, in contrast to an ordinary p-n junction of a conventional semiconductor diode. A Schottky diode is characterized by a low forward voltage drop (e.g., 0.1-0.4 V) and very fast switching action due to the almost nonexistent depletion width in the metal. Schottky diodes find application in a variety of power devices including switched-mode power supplies and power converters.

A type of Schottky rectifier structure called a Trench MOS Barrier Schottky (TMBS) rectifier is commonly used in applications requiring a breakdown voltage (BV) in the range of 100 V-200 V. High-voltage Schottky diodes having a BV higher than ~300V are typically designed by connecting multiple lower voltage Schottky diodes (e.g., TMBS structures) in series. This is due to the fact that monolithically integrated (i.e., on a single semiconductor die) Schottky diodes with a BV greater than, say, 200 V, are problematic to manufacture. One difficulty lies in adequately shielding the Schottky junction from the high reverse bias voltage in the off-state. Inadequate shielding of the Schottky junction causes high leakage current under reverse bias conditions. In addition, stacking a series of TMBS devices to create a Schottky diode with a BV greater than ~300 V is very costly.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

In the following description, numerous specific details are set forth in order to provide a thorough understanding of the present invention. It will be apparent, however, to one having ordinary skill in the art that the specific details need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

In the context of the present application, a high voltage Schottky diode device structure is capable of supporting 300 volts or more in a reverse bias condition. For purposes of this disclosure, "ground" or "ground potential" refers to a reference voltage or potential against which all other voltages or potentials of a circuit or IC are defined or measured. The term "loop" or "loop shape" refers to a region having a laterally continuous closed curve shape, whether the shape is oval, ring-like, circular, racetrack, rectilinear (with rounded corners) or serpentine, such as a closed path that winds or turns back on itself (e.g., a comb shape).

Figure 1:
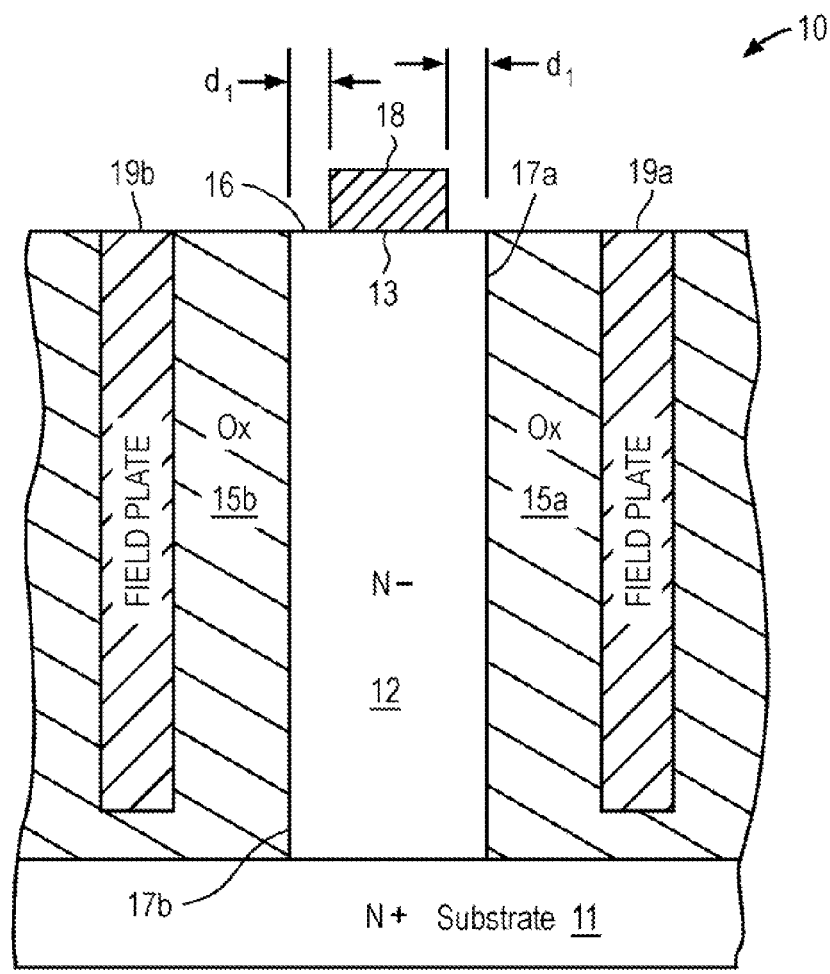
FIG. 1 illustrates a cross-sectional side view of an example high-voltage monolithic Schottky device structure.

FIG. 1 illustrates a cross-sectional side view of an example high-voltage monolithic Schottky device 10 having a structure that includes a vertically extended lightly doped (N−) pillar 12 of semiconductor (e.g., silicon) formed on top of a more heavily doped (N+) doped semiconductor substrate 11. Substrate 11 is heavily doped to minimize its resistance to current flowing through to the electrode which is located on the bottom of substrate 11 in the completed device. In one embodiment, pillar 12 forms a drift region of the Schottky device that extends from substrate 11 to a top surface 16 of the silicon wafer.

In one embodiment, the doping concentration of pillar 12 is linearly graded to produce a drift region that exhibits a substantially uniform electric-field distribution. The doping concentration of pillar 12 is highest at the bottom of the pillar, i.e., next to substrate 11, and lowest at top surface 16. In certain embodiments, linear grading may stop at some point below top surface 16 of pillar 12.

As shown, pillar 12 includes sidewalls 17a & 17b that adjoin thick dielectric (e.g., oxide) layers 15a & 15b, respectively. The height and width of pillar 12, as well as the lateral thickness of dielectric layers 15a & 15b may be determined by the breakdown voltage requirements of the Schottky device 10. In various embodiments, pillar 12 has a vertical height (thickness) in a range of about 30 µm to 120 µm thick. For example, high-voltage monolithic Schottky device formed on a die approximately 1 mm×1 mm in size may have a pillar 12 with a vertical thickness of about 60 µm. By way of further example, a high-voltage Schottky device structure formed on a die of about 2 mm-4 mm on each side may have a pillar 12 that is approximately 30 µm thick. In certain embodiments, the lateral width of pillar 12 is as narrow as can be reliably manufactured (e.g., about 0.4 µm to 0.8 µm wide) in order to achieve a very high breakdown voltage (e.g., 600-800 V).

Continuing with the example of FIG. 1, a Schottky metal layer 18 is shown centered above and in electrical contact with top surface 16 of pillar 12. A Schottky barrier or diode is thereby created between Schottky metal layer 18 and the underlying N type silicon pillar 12. The opposing lateral sides of Schottky metal layer 18 are separated by a distance $d_1$ from the corresponding lateral sidewalls 17a & 17b of pillar 12. Schottky metal layer 18 may comprise any one of a number of well-known metals used for creating a Schottky barrier, including, platinum, titanium, or other common alloy metals. In some cases, even aluminum or an aluminum alloy may be utilized. Practitioners in the art will appreciate that the metal used to implement Schottky metal layer 18 typically differs from that used to contact field plates 19a & 19b. Schottky metal layer 18 may also differ from the type of metal utilized to interconnect field plates 19 with Schottky metal layer 18. For instance, the metallization traces used to interconnect Schottky metal layer 18 with field plates 19a & 19b typically comprises aluminum.

Dielectric regions 15a & 15b may comprise silicon dioxide, silicon nitride, or other suitable dielectric materials. Dielectric regions 15a & 15b may be formed using a variety of well-known methods, including thermal growth and chemical vapor deposition. Field plates 19a & 19b are shown respectively disposed within dielectric layers 15a & 15b, each being fully insulated from substrate 11 and pillar 17. In one embodiment, the lateral thickness of oxide region 15 that separates each field plate 19 from the respective sidewall 17 of pillar 12 is approximately 4 µm.

The conductive material used to from field plates 19a & 19b may comprise a heavily doped polysilicon, a metal (or metal alloys), a silicide, or other suitable materials. In the completed device structure, field plates 19a & 19b normally function as capacitive plates that may be used to deplete the drift region of charge when the device is in the off state. In the off state, the electrode coupled to the bottom of substrate 11 is raised to a high voltage potential with respect to that of Schottky metal layer 18 and field plates 19a & 19b. Typically, Schottky metal layer 18 and field plates 19a & 19b are each coupled to ground. In this reverse bias condition, field plates 19 function to deplete the drift region which comprises N− pillar 12 of charge, thereby supporting the high voltage potential along the entire vertical thickness of pillar 12.

Figure 2:
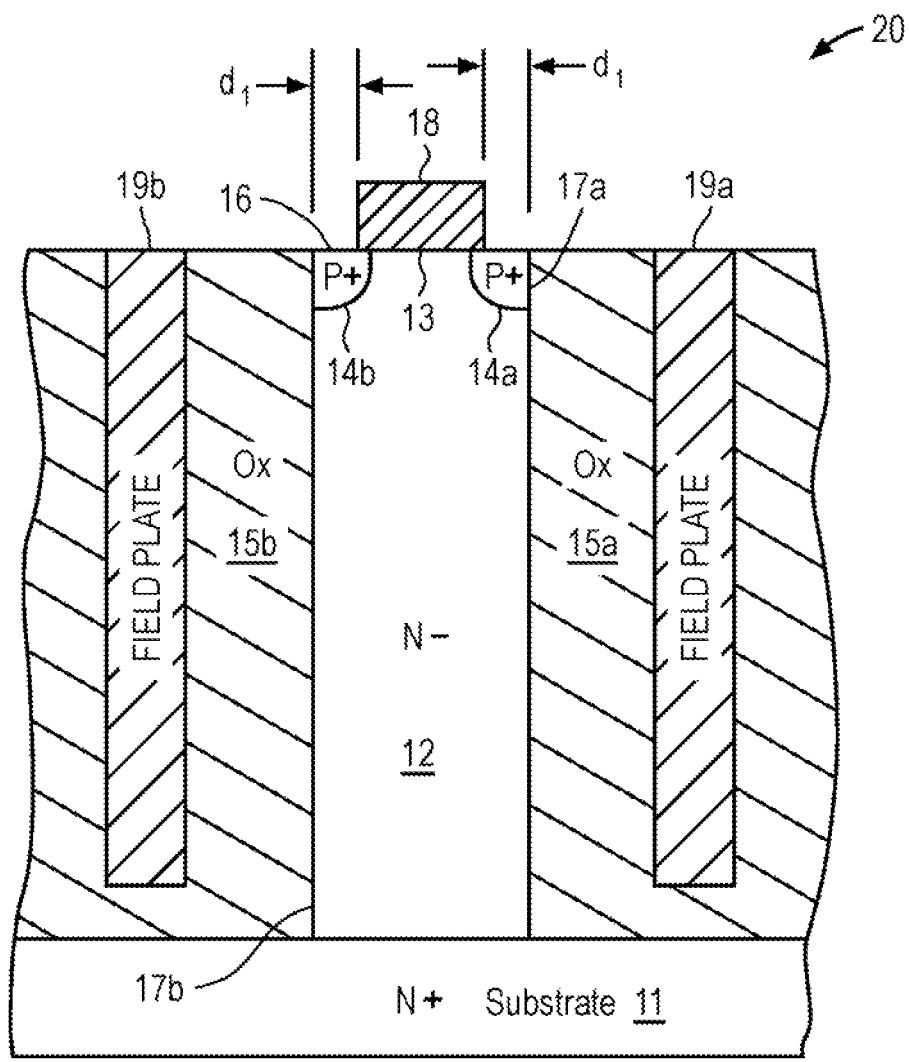
FIG. 2 illustrates a cross-sectional side view of another example high-voltage monolithic Schottky device structure.

FIG. 2 illustrates a cross-sectional side view of another example high-voltage monolithic Schottky device 20. The device structure shown in FIG. 2 is identical to that shown in FIG. 1, except that device 20 further includes P+ regions 14a & 14b disposed at opposite corners of top surface 16 adjoining sidewalls 17a & 17b, respectively. Each of P+ regions 14a & 14b extends slightly beneath the corresponding lateral side or edge of Schottky metal layer 18 such that no Schottky barrier exists at the side corners or tips of metal layer 18. In other words, P+ regions 14 block the Schottky barrier at the tips of metal layer 18, thereby protecting Schottky device 20 from deleterious effects that commonly occur at the edge of the Schottky diode junction. Practitioners in the art will appreciate that P+ regions 14 may each be formed using ordinary deposition, diffusion, and/or implantation processing techniques.

Figure 3:
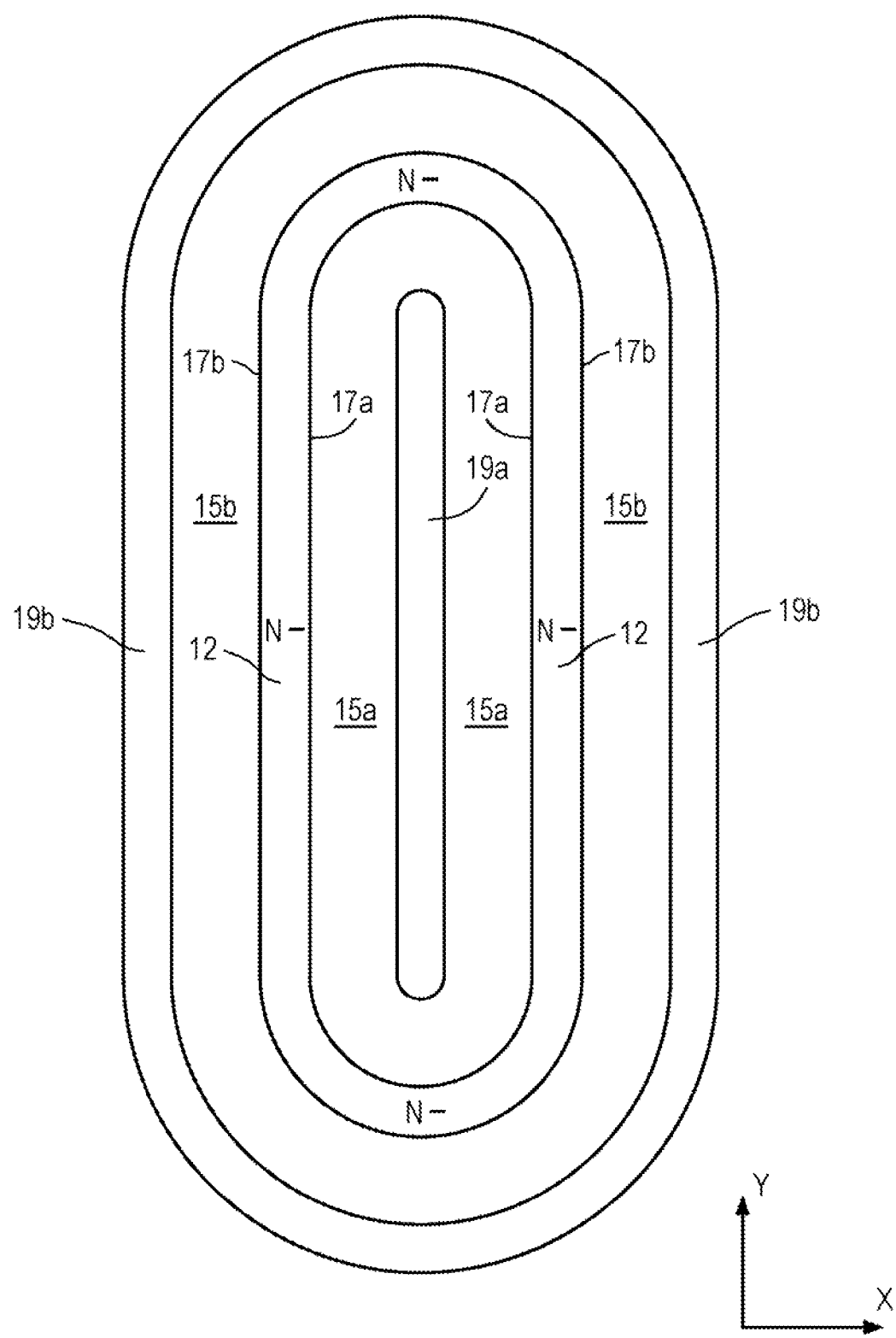
FIG. 3 illustrates a top-down view of an example layout for the device structure shown in FIG. 1.

FIG. 3 illustrates a top-down view of an example layout for the device structure shown in FIG. 1. The top view of FIG. 3 shows the high-voltage monolithic Schottky device formed as "racetrack" shaped structure, with various regions/elements arranged in an elongated ring or oval pattern. For example, silicon pillar 12 is shown arranged in a racetrack shape comprising two, parallel elongated straight sections that extend in a first lateral direction (y-direction). The straight sections are connected at opposite ends by respective semi-circular sections (e.g., half-circles). In other words, pillar 12 extends laterally in the x and y lateral directions to form a continuous, elongated, racetrack-shaped ring or oval.

As shown, pillar 12 is surrounded on opposite sides by dielectric regions 15a & 15b. That is, pillar 12 laterally surrounds dielectric layer 15a, adjoining sidewall 17a on the inside, with dielectric layer 15b laterally surrounding pillar 12 adjoining sidewall 17b on the outside. Field plate 19a is disposed within dielectric region 15a and is formed in the shape of a single elongated member that terminates at both ends in a rounded fingertip area. Field plate 19b, on the other hand, comprises an enlarged ring or oval that encircles dielectric layer 15b and pillar 12. Persons of skill in the semiconductor arts will appreciate that field plates 19b of adjacent racetrack structures may be merged together such that they share a common member on a side.

It should also be understood that in the example of FIG. 3, the racetrack shaped high-voltage Schottky device has a width (i.e., pitch) in the x-direction that is substantially less than the length in the y-direction. For example, in one embodiment, the width in the x-direction is approximately 13 µm, with the length in the y-direction being in a range of about 400 µm to 1000 µm, with a pillar height (vertical thickness) of about 60 µm. In other words, the length to width ratio of the racetrack layout is in a range of about 30 up to 80. In one embodiment, the length of each racetrack shaped Schottky device structure is at least 20 times greater than its pitch or width.

Figure 4:
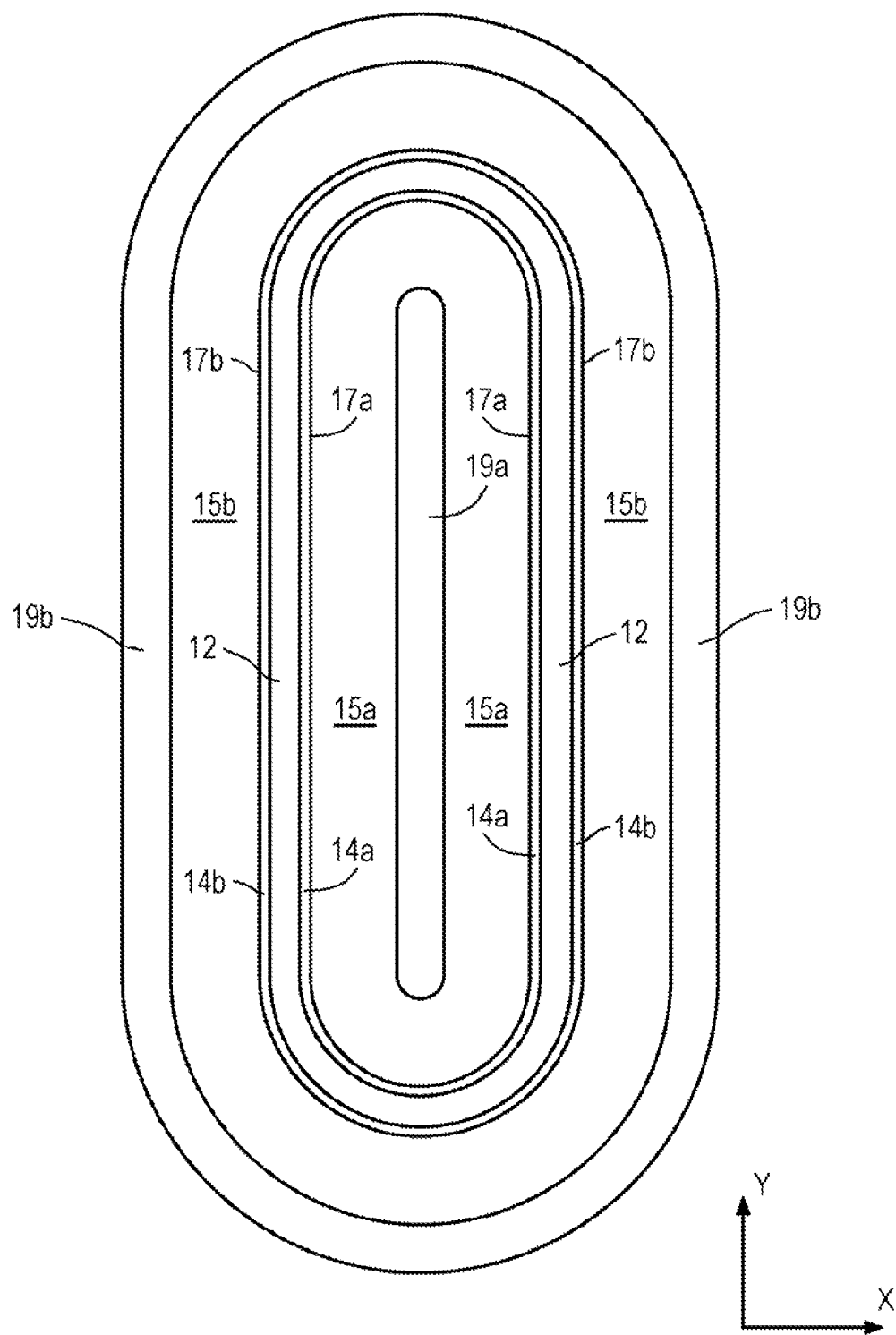
FIG. 4 illustrates a top-down view of an example layout for the device structure shown in FIG. 2.

FIG. 4 illustrates a top-down view of an example layout for the device structure shown in FIG. 2, which layout is the same as that shown in FIG. 3, except for the inclusion of P+ regions 14a & 14b. As shown, P+ region 14a is formed as a single continuous region in a racetrack shape that adjoins sidewall 17a. Similarly, P+ region 14b is a continuous region formed in a racetrack shape that adjoins sidewall 17b.

Figure 5:
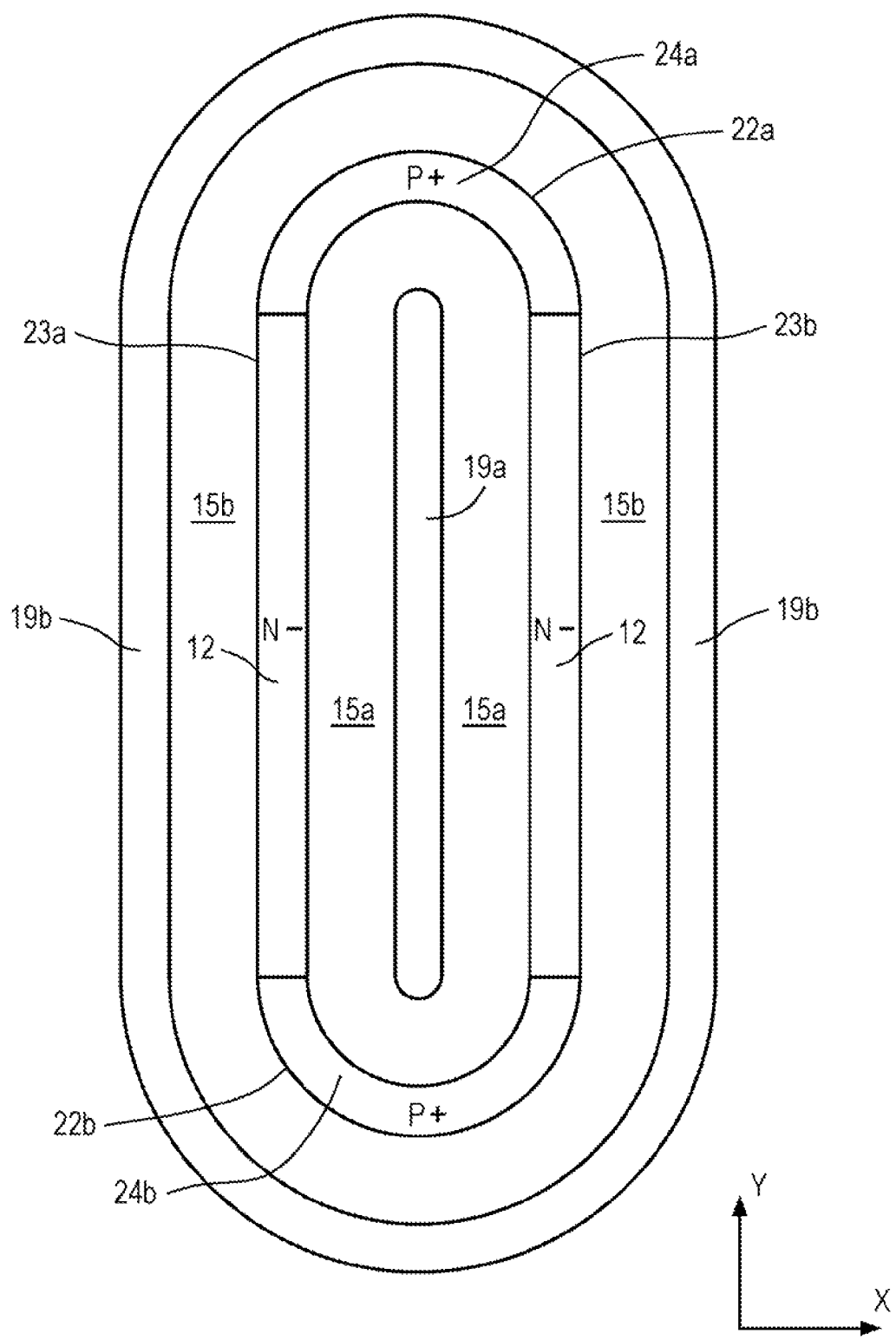
FIG. 5 illustrates a top-down view of another example layout for an high-voltage monolithic Schottky device structure.

FIG. 5 illustrates a top-down view of another example layout for a high-voltage monolithic Schottky device structure. In this embodiment, instead of arranging pillar 12 as a continuous N− region in a racetrack shape, the N− drift region is confined to the two straight sections 23a & 23b that extend in the y-direction. Each of sections 23a & 23b are joined at the ends by half-circular sections 22a & 22b which comprise P+ regions 24a & 24b, respectively. Although not shown for reasons of clarity, in this example the Schottky metal layer extends only over sections 23a & 23b. That is, the Schottky barrier metal extends over each N− region of pillar 12 from the junction where straight sections 23a & 23b of pillar 12 meet with half-circular section 24a at one end, to the junction where straight sections 23a & 23b of pillar 12 meet with half-circular section 24b at the other end.

It is appreciated that in different alternative embodiments, the location around the racetrack layout where the N− regions meet the P+ regions may vary. In other words, it need not be located where the racetrack transitions from a straight to a curved or semi-circular shape.

Figure 6:
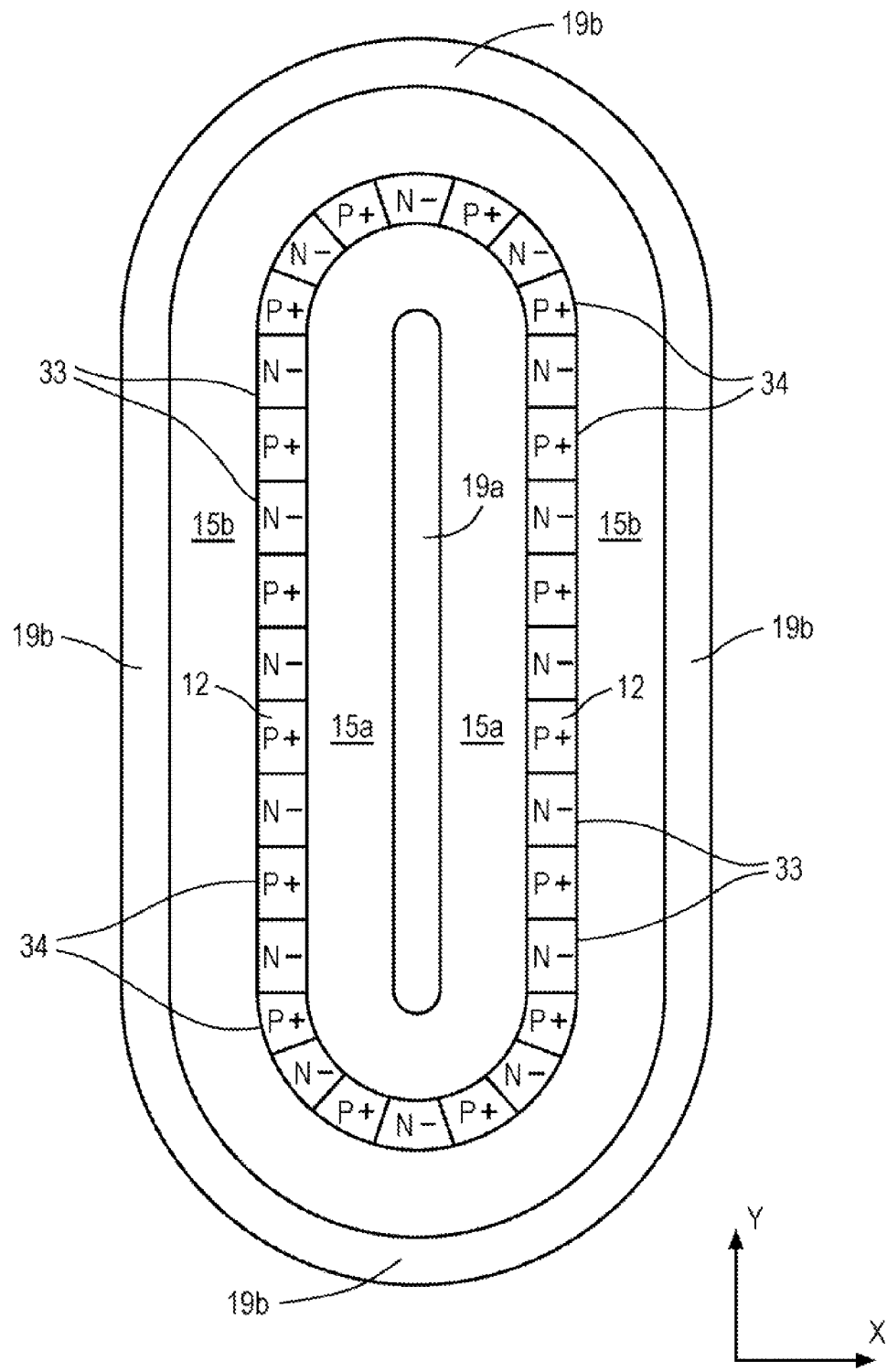
FIG. 6 illustrates a top-down view of yet another example layout of an high-voltage monolithic Schottky device structure.

FIG. 6 illustrates a top-down view of yet another example layout for a high-voltage monolithic Schottky device structure. In this embodiment, pillar 12 is formed in a racetrack shaped layout comprising alternate N− and P+ regions 33 and 34, respectively. As shown, each P+ region 34 is adjoined on opposite lateral sides by N− regions 33. Similarly, each N− region 33 is adjoined on opposite lateral sides by P+ regions 34. Schottky metal layers (not shown) are formed only over N− regions 33.

Practitioners in the art will appreciate that in the completed device structure, patterned metal layers are used to interconnect each of the Schottky metal layers formed over the individual N− regions. That is, in a practical embodiment, all of the Schottky metal layers 18 are respectively wired together, and also to the field plates 19a & 19b and corresponding electrodes on the semiconductor die. Furthermore, it should be understood that in the embodiments shown, multiple racetrack shaped segments may be arranged in a side-by-side or staggered relationship substantially across the semiconductor die to form a single high-voltage monolithic Schottky diode device. In the examples shown and described herein, it is further appreciated that the width of dielectric layers 15a & 15b, as well as the width of field plates 19a & 19b, is substantially uniform across the semiconductor die. Laying out the transistor segments with uniform widths and separation distances prevents the formation of voids or holes following the processing steps used to conformably deposit the layers that comprise dielectric regions 15 and field plates 19.

Figure 7:
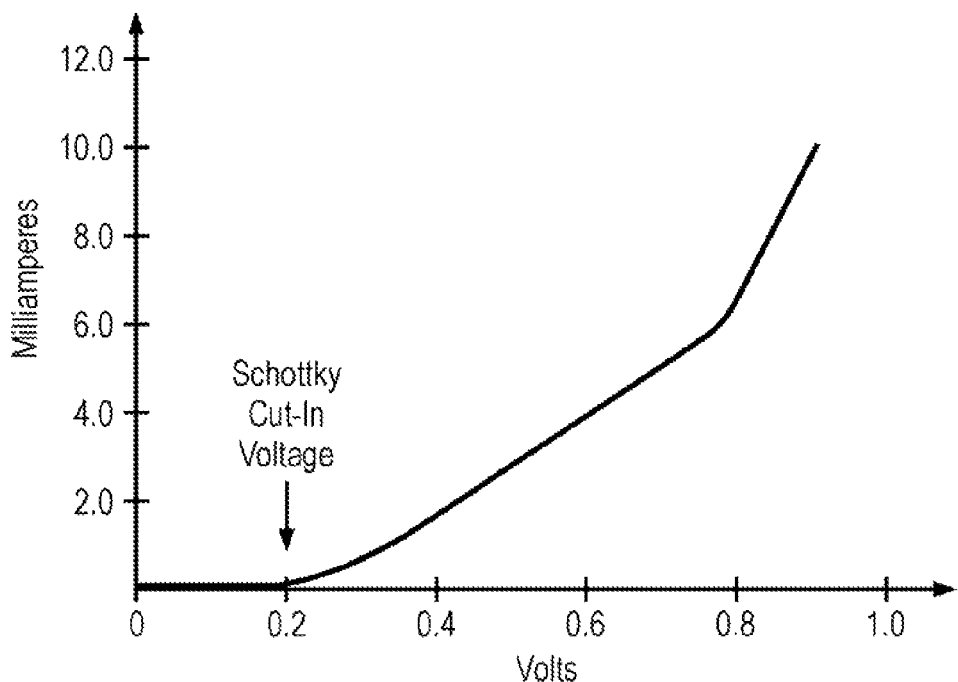
FIG. 7 is a graph illustrating forward bias current-voltage characteristics of an example high-voltage monolithic Schottky device structure.
Figure 8:
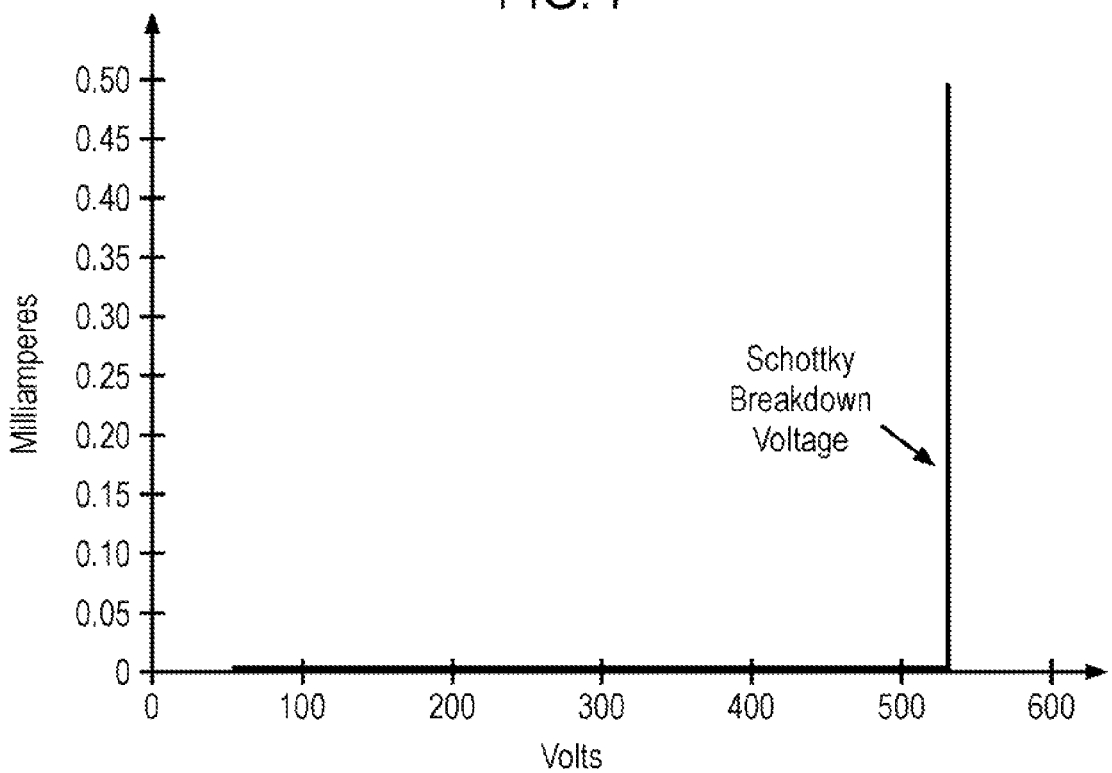
FIG. 8 is a graph illustrating reverse bias current-voltage characteristics of an example high-voltage monolithic Schottky device structure.

FIGS. 7 and 8 are graphs that illustrate the respective forward and reverse bias current-voltage characteristics of an example high-voltage monolithic Schottky device structure manufactured in accordance with the teachings of the present disclosure. As shown, the "cut-in" or turn-on voltage of the Schottky diode in the forward direction is approximately 0.2 volts. In the reverse bias condition (off state), the Schottky device structure is shown supporting about 525 V.

Figure 9:
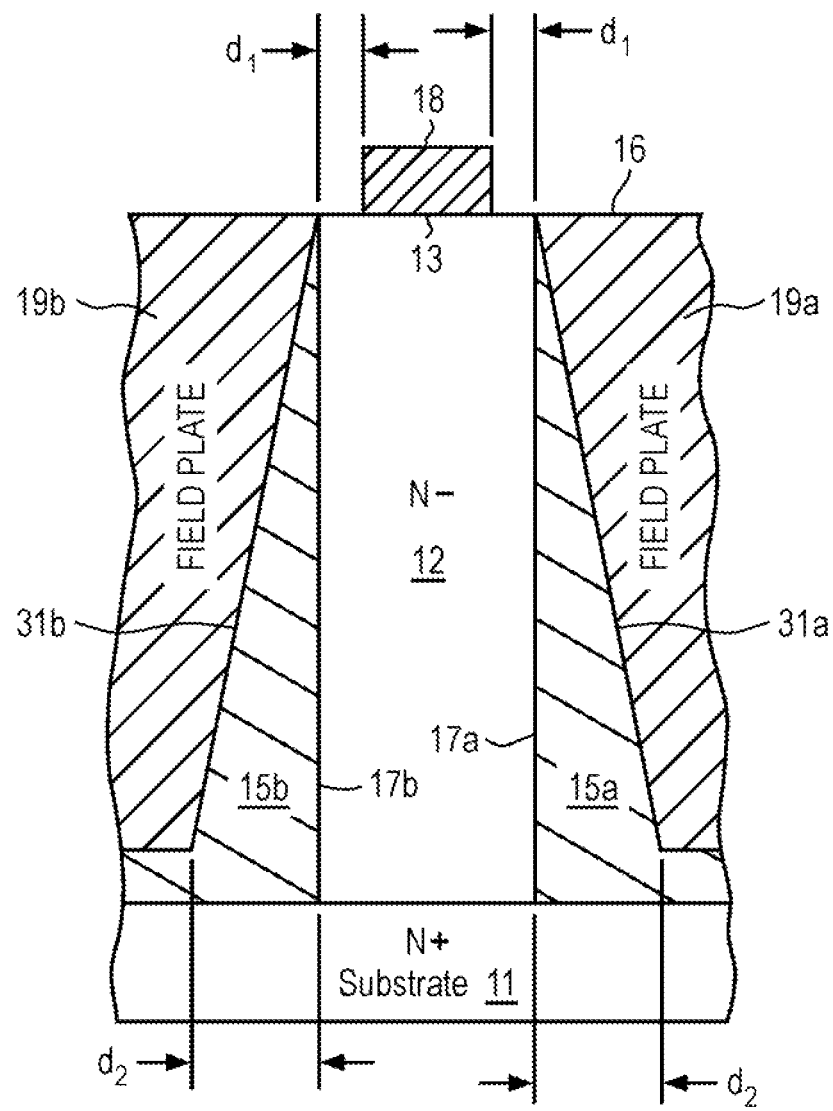
FIG. 9 illustrates a cross-sectional side view of an example high-voltage monolithic Schottky device structure having tapered dielectric layers and field plates.

FIG. 9 illustrates a cross-sectional side view of an example high-voltage monolithic Schottky device structure having tapered dielectric layers and field plates. In each of the previous embodiments the lateral thickness of the dielectric (oxide) material separating the semiconductor pillar from the respective field plates is substantially constant with vertical height. In the example device structure shown in FIG. 9, however, includes a tapered sidewall profile adjoining the respective field plates such that the first and second field plates 19a & 19b are each separated from the pillar by a lateral distance that increases linearly in the vertical direction. For instance, at top surface 16 the lateral thickness of layers 15a & 15b is minimal, e.g., substantially zero; whereas at the bottom of field plates 19a & 19b the lateral thickness of layers 15a & 15b is maximal. This maximum thickness is shown as dimension $d_2$ in FIG. 9. By way of example, distance $d_2$ may be ~4 μm in one embodiment.

Note that field plates 19a & 19b are also tapered in a corresponding manner with respect to dielectric layers 15a & 15b. That is, field plates 19 have a lateral width that is widest at top surface 16 and narrowest at the bottom, i.e., nearest substrate 11. It is also worth noting that the tapering of dielectric layers 15a & 15b, as well as field plates 19a & 19b is symmetrical about the center of pillar 12.

In an alternative embodiment, the lateral thickness of dielectric layers 15 at top surface 16 may be greater than zero. In other words, the lateral thickness of the sidewall oxide layer separating pillar 12 from field plates 19 may be some distance greater than zero.

In the example of FIG. 9 the doping concentration in pillar 12 may be made constant and equal to the high doping concentration (e.g., $3 \times 10^{16}$ cm$^{-3}$) near the interface between pillar 12 and N+ substrate 11 in the previous embodiments. Stated differently, the doping concentration in pillar 12 may be relatively high across the entire vertical dimension of pillar 12 from top surface 16 down to the interface between pillar 12 and substrate 11. One advantage of doping pillar 12 at a high concentration that is constant with vertical height is a substantially lowered drift resistance (e.g., factor of 3×). By way of example, a Schottky transistor device having a structure shown in FIG. 9 can achieve a breakdown voltage (BV) greater than 550 V with specific on-resistance (Rdson) of approximately 0.75 ohm-mm$^2$. In addition, practitioners in the arts will appreciate that achieving uniform doping in the epitaxial layer that forms pillar 12 is considerably easier from a processing/production standpoint.

Figure 10:
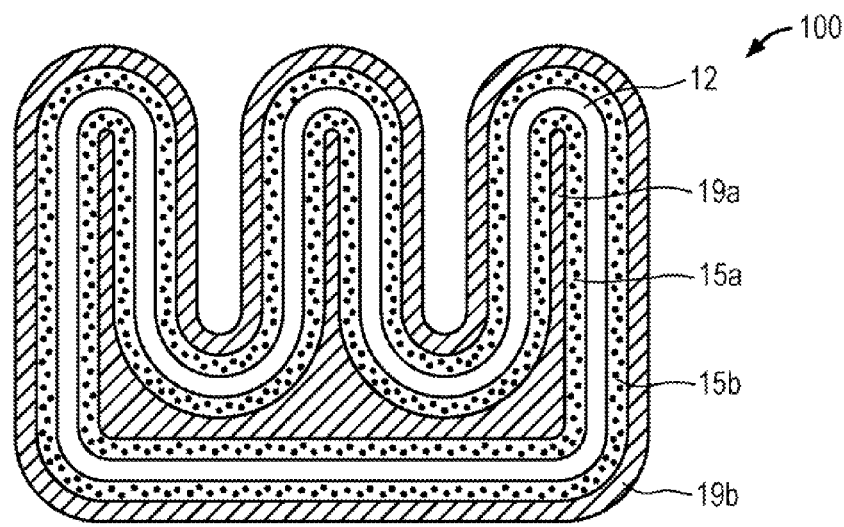
FIG. 10 illustrates a top-down view of yet another example layout for an high-voltage monolithic Schottky device structure.

FIG. 10 illustrates a top-down view of yet another example layout for a high-voltage monolithic Schottky device structure 100. In this embodiment, instead of arranging pillar 12 as a continuous N− region in a racetrack shape, the N− drift region which comprises pillar 12 has a comb-like shape that includes a plurality of rounded fingers that are connected or joined in a horizontally extended section across the bottom of the layout. As shown, the inner field plate 19a comprises three vertically-extended fingers that each terminate in a rounded tip at the top of the layout, and combine into an extended horizontal area at the bottom of the layout. Inner dielectric region 15a laterally separates inner field plate 19a from N− drift region 12, which laterally surrounds inner field plate 19a. Similarly, outer dielectric region 15b laterally surrounds pillar 12 and separates pillar 12 from outer field plate 19b. Note that at all lateral points, pillar 12 is separated from both the inner field plate 19a and outer field plate 19b by a substantially equal distance.

Although not shown for reasons of clarity, in the example of FIG. 10 the Schottky metal layer shown in the previous cross-sectional drawings may extend over the entirety (or portions) of N− drift region of pillar 12.

Figure 11:
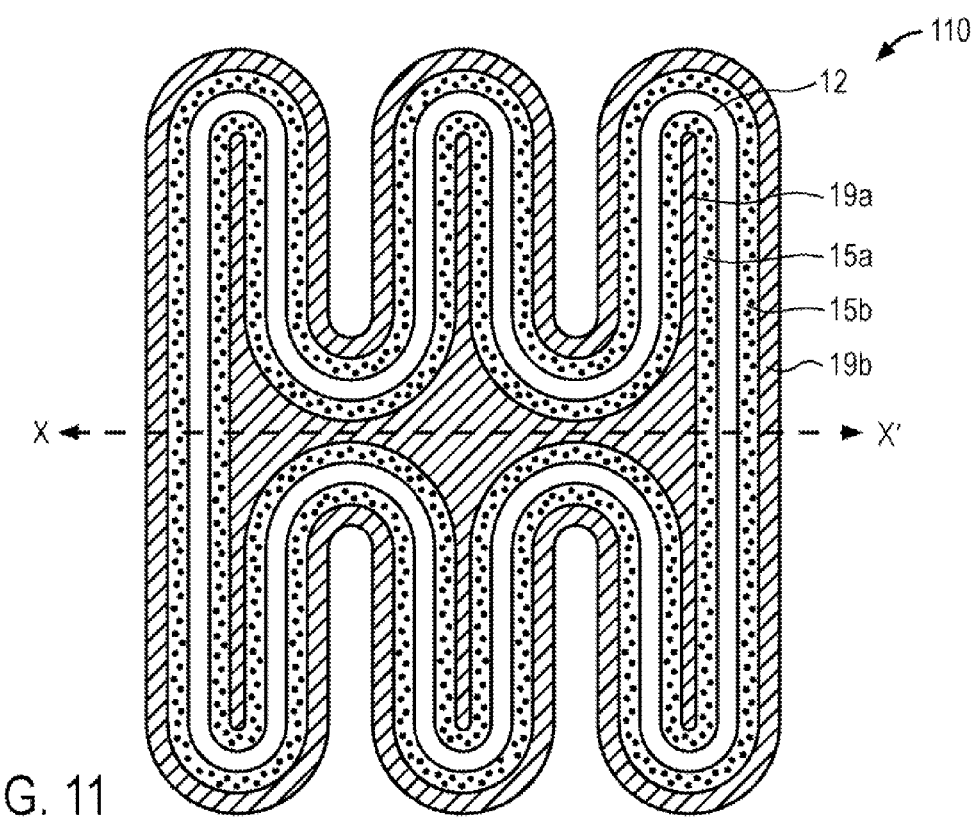
FIG. 11 illustrates a top-down view of still another example layout for an high-voltage monolithic Schottky device structure.

FIG. 11 illustrates a top-down view of still another example layout for a high-voltage monolithic Schottky device structure 110. As shown, the layout in FIG. 11 is a two-sided mirrored version (i.e., a double-comb layout shape) of the device layout shown in FIG. 10; symmetrical about cut lines X-X'. In the embodiments of both FIGS. 10 and 11, pillar 12 comprises a continuous serpentine closed-loop shape layout, with dielectric regions 15a & 15b tracking the shape of pillar 12 laterally about layout 110. It is appreciated that in both layouts 100 and 110, the number of fingers or rounded members that make up the comb shape may vary in length (vertically as shown in FIGS. 10 & 11) and/or width, as well as the number of fingers extending in the horizontal lateral direction.

Figure 12:
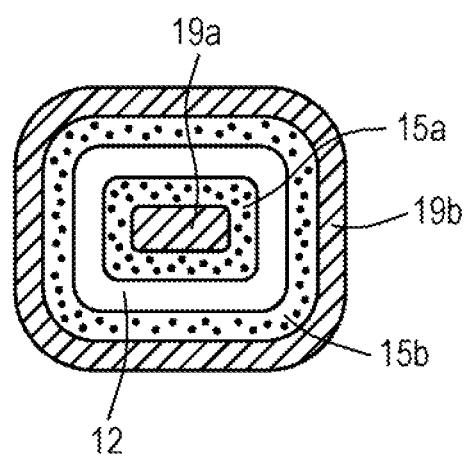
FIG. 12 illustrates a top-down view of an additional example layout for an high-voltage monolithic Schottky device structure.

FIG. 12 illustrates a top-down view of an additional example layout for an high-voltage monolithic Schottky device structure. As shown, the inner field plate 19a has a relatively short "stub" shape that has a length (in the horizontal direction) only slightly longer that its width (in the vertical direction). Each of the four corners of inner field plate 19a is rounded. In other implementations, inner field plate 19a may have a length-to-width aspect ratio that is substantially 1:1. In other words, in certain embodiments, inner field plate 19a may have a substantially square shape, or, in some cases, be substantially circular.

The remainder of the layout of FIG. 12 comprises a series of concentric rings or loops that successively surround the adjacent inner region in a substantially circular shape. For example, inner dielectric region 15a laterally surrounds inner field plate 19a; pillar 12 is a ring-like loop that adjoins and surrounds inner dielectric region 15a; outer dielectric region 15b laterally surrounds and adjoins pillar 12; and outer field plate 19b laterally surrounds and adjoins dielectric region 15b. Practitioners in the art will appreciate that the concentric pattern shown in FIG. 12 may be replicated many times on a semiconductor die. That is, the semi-circular pattern shown in FIG. 12 may be replicated in a side-by-side manner so as to form an array with numerous rows and columns that extend across the die. Alternatively, successively larger ring-shaped regions may successively surround the inner regions in the same dielectric-silicon-dielectric-field plate pattern shown in FIG. 12.

It should be further understood that each of the layouts shown an described by way of example in FIGS. 10-12 may comprise pillars arranged with laterally alternating N− and P+ regions as shown in FIGS. 5 & 6. Similarly, any of these layouts may include P+ regions 14a & 14b at the top of pillar 12, as shown in FIGS. 2 & 4. Additionally, any of the device structure layouts shown in FIGS. 10-12 may be fabricated in accordance with the example high-voltage monolithic Schottky device structure having tapered dielectric layers and field plates shown in FIG. 9.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive

I claim:

1. A semiconductor device comprising:
 a substrate of a first conductivity type;
 a pillar of the first conductivity type, the pillar having a vertical thickness that extends from a top surface down to the substrate, the pillar extending in first and second lateral directions in a loop shape, the loop shape having a pair of substantially parallel, elongated straight sections that extend in the first lateral direction, the pair of straight sections being connected at opposite ends by respective first and second semi-circular sections that span the second lateral direction;
 first and second dielectric regions disposed on opposite lateral sides of the pillar, respectively, the first dielectric region being laterally surrounded by the pillar, and the second dielectric region laterally surrounding the pillar;
 first and second field plates respectively disposed in the first and second dielectric regions, the first and second field plates being formed of a conductive material;
 a metal layer disposed on the top surface of the pillar only over each of the straight sections of the loop-shaped layout, the metal layer forming a Schottky diode with respect to the pillar;
 wherein when the substrate is raised to a high-voltage potential with respect to both the metal layer and the first and second field plates, the first and second field plates functioning capacitively to deplete the pillar of charge, thereby supporting the high-voltage potential along the vertical thickness of the pillar.

2. The semiconductor device of claim 1 wherein the high-voltage potential is 300 V or greater.

3. The semiconductor device of claim wherein the metal layer comprises platinum or titanium.

4. The semiconductor device of claim 1 wherein the pillar has a substantially linear doping concentration gradient through the vertical thickness, the pillar having a lowest doping concentration nearest the top surface and a highest doping concentration nearest the substrate.

5. The semiconductor device of claim 1 wherein the pillar has first and second sidewalls that laterally adjoin the first and second dielectric regions, respectively.

6. The semiconductor device of claim 5 wherein the metal layer is centered over each of the straight sections of the pillar, with first and second sides of the metal layer being respectively separated from the first and second sidewalls by a substantially equal distance.

7. The semiconductor device of claim 6 further comprising first and second regions of a second conductivity type disposed in the pillar at the top surface, the first region extending from the first sidewall to beneath the first side of the metal layer, and the second region extending from the second sidewall to beneath the second side of the metal layer.

8. The semiconductor device of claim 1 wherein the first and second field plates are fully insulated from the pillar, the first field plate being laterally surrounded by the pillar, and the second field plate laterally surrounding the pillar.

9. A semiconductor device comprising:
 a substrate of a first conductivity type;
 a pillar of the first conductivity type formed on the substrate, the pillar having first and second sidewalls and a vertical thickness that extends from a top surface down to the substrate, the pillar extending in first and second lateral directions to form a loop-shaped layout which includes a pair of substantially parallel, elongated straight sections having a length that extends in the first lateral direction, the pair of straight sections being connected at opposite ends by respective first and second semi-circular sections that span a width of the loop-shaped layout in the second lateral direction;
 first and second dielectric regions respectively adjoining the first and second sidewalls of the pillar, respectively, the first dielectric region being laterally surrounded by the pillar, and the second dielectric region laterally surrounding the pillar;
 first and second field plates respectively disposed in the first and second dielectric regions, the first and second field plates being formed of a conductive material;
 a metal layer disposed on the top surface of the pillar, the metal layer only, extending over each of the straight sections, first and second sides of the metal layer being respectively separated from the first and second sidewalls by a substantially equal distance, the metal layer forming a Schottky diode with respect to the pillar;

wherein when the substrate is raised to a high-voltage potential with respect to both the metal layer and the first and second field plates, the first and second field plates functioning capacitively to deplete the pillar of charge, thereby supporting the high-voltage potential along the vertical thickness of the pillar.

10. The semiconductor device of claim 9 further comprising a region of a second conductivity type opposite to the first conductivity type, the region being formed in the pillar at the top surface in the semi-circular sections of the loop-shaped layout.

11. The semiconductor device of claim 10 further comprising a plurality of regions of a second conductivity type opposite to the first conductivity type, the regions being formed in the pillar spaced-apart at the top surface in the semi-circular sections so as to form a series of laterally alternating regions of the first and second conductivity types at the top surface continuously around the loop-shaped layout.

12. The semiconductor device of claim 9 wherein the high-voltage potential is 300 V or greater.

13. The semiconductor device of claim 9 wherein the pillar has a substantially constant doping concentration through the vertical thickness.

14. A semiconductor device comprising:
a substrate of a first conductivity type;
a pillar of the first conductivity type formed on the substrate, the pillar having first and second sidewalls and a thickness in a vertical direction that extends from a top surface down to the substrate, the pillar extending in first and second lateral directions to form a racetrack-shaped layout which includes a pair of substantially parallel, elongated straight sections having a length that extends in the first lateral direction, the pair of straight sections being connected at opposite ends by respective first and second semi-circular sections that span a width of the racetrack-shaped layout in the second lateral direction;
first and second dielectric regions respectively adjoining the first and second sidewalls of the pillar, respectively, the first dielectric region being laterally surrounded by the pillar, and the second dielectric region laterally surrounding the pillar;
first and second field plates respectively disposed in the first and second dielectric regions, the first and second field plates being formed of a conductive material, the first and second dielectric regions each having a tapered sidewall profile adjoining the respective first and second field plates such that the first and second field plates are each separated from the pillar by a lateral distance that increases in the vertical direction down from the top surface;
a metal layer disposed on the top surface of the pillar, the metal layer only extending over each of the straight sections, first and second sides of the metal layer being respectively separated from the first and second sidewalls by a substantially equal distance, the metal layer forming a Schottky diode with respect to the pillar;
wherein when the substrate is raised to a high-voltage potential with respect to both the metal layer and the first and second field plates, the first and second field plates functioning capacitively to deplete the pillar of charge, thereby supporting the high-voltage potential along the vertical thickness of the pillar.

15. The semiconductor device of claim 14 wherein the high-voltage potential is 300 V or greater.

16. The semiconductor device of claim 14 wherein the pillar has a substantially constant doping concentration through the thickness in the vertical direction.

17. The semiconductor device of claim 14 wherein the first field plate is formed as an elongated linear section having rounded ends, and the second field plate being formed as an enlarged racetrack-shaped layout, the first and second field plates each being laterally separated from the pillar along all points of the racetrack-shaped layout by a substantially equal distance.

18. The semiconductor device of claim 14 wherein the lateral distance is substantially zero at the top surface.

19. The semiconductor wafer of claim 14 wherein the first and second field plates comprise polysilicon.

20. The semiconductor wafer of claim 14 wherein the first and second dielectric regions comprise oxide.

21. The semiconductor wafer of claim 14 wherein the metal layer comprises platinum or titanium.

* * * * *